(12) United States Patent
Fang

(10) Patent No.: US 6,933,616 B2
(45) Date of Patent: Aug. 23, 2005

(54) MULTI-CHIP MODULE PACKAGING DEVICE USING FLIP-CHIP BONDING TECHNOLOGY

(75) Inventor: Jen-Kuang Fang, Kaoshiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 10/282,637

(22) Filed: Oct. 29, 2002

(65) Prior Publication Data
US 2003/0094693 A1 May 22, 2003

(30) Foreign Application Priority Data
Nov. 20, 2001 (TW) ......................... 90128736 A

(51) Int. Cl.⁷ .................... H01L 23/52; H01L 29/40
(52) U.S. Cl. ................. 257/784; 527/723; 527/734
(58) Field of Search ............................ 257/690–696, 257/723, 724, 706, 707, 734, 738, 777, 778, 781, 784, 796, 779

(56) References Cited

U.S. PATENT DOCUMENTS

| | | | |
|---|---|---|---|
| 5,773,359 A | * | 6/1998 | Mitchell et al. ............ 438/614 |
| 5,783,860 A | * | 7/1998 | Jeng et al. .................. 257/675 |
| 5,811,317 A | * | 9/1998 | Maheshwari et al. ......... 29/827 |
| 6,335,104 B1 | * | 1/2002 | Sambucetti et al. ......... 428/615 |
| 6,342,726 B2 | * | 1/2002 | Miyazaki et al. ........... 257/668 |
| 6,396,156 B1 | * | 5/2002 | Tang et al. .................. 257/779 |
| 6,437,434 B1 | * | 8/2002 | Sugizaki ..................... 257/692 |
| 6,452,279 B2 | * | 9/2002 | Shimoda ..................... 257/777 |
| 6,452,280 B1 | * | 9/2002 | Shiraishi et al. ............ 257/778 |
| 6,576,993 B2 | * | 6/2003 | Akram ....................... 257/696 |
| 6,696,765 B2 | * | 2/2004 | Kazama et al. ............. 257/779 |
| 2001/0017408 A1 | * | 8/2001 | Baba .......................... 257/713 |
| 2002/0031880 A1 | * | 3/2002 | Chien et al. ................ 438/200 |
| 2003/0099767 A1 | * | 5/2003 | Fang ........................... 427/96 |

OTHER PUBLICATIONS

Peter Van Zant, Microchip Fabrication, 2000, McGraw–Hill, Fourth Edition, 572–573.*

Chales A. Harper, Electronic Packaging and Interconnection Handbook, McGraw–Hill, 2000, 1.24 and 1.25.*

* cited by examiner

Primary Examiner—Amir Zarabian
Assistant Examiner—Monica Lewis
(74) Attorney, Agent, or Firm—Seyfarth Shaw LLP

(57) ABSTRACT

The present invention discloses a multi-chip module packaging device which has outward extension portions of under bump metallurgies (UBM) for satisfying the bonding area requirement during wire bonding operation. Therefore, chips have electrical connections with metal bonding wires welded on the extended portions for transmitting electrical signals between each other. That is, the number of circuit layers of the substrate used in the device can be reduced; furthermore save on the production cost.

11 Claims, 3 Drawing Sheets

MULTI-CHIP MODULE PACKAGING DEVICE USING FLIP-CHIP BONDING TECHNOLOGY

BACKGROUND OF THE INVENTION

1. Field of the Invention

The invention relates to a multi-chip module (MCM) packaging device, especially to an MCM using the flip-chip bonding technology.

2. Description of the Related Art

Because of the increasing requirements for the portability and integral versatility of consumer electronic products, the packaging technology for the multi-chip module undoubtedly can provide the best way to meet above-mentioned requirements. However, in order to integrate functions of multiple chips, the technique mostly needs to use multi-layer circuit laminated board. For example, as shown in FIG. 1, it shows a substrate 10 provided with six-layer circuit layers.

The price of the substrate is 40~60% of the total packaging cost, and the manufacturing cost of the substrate depends on the number of the circuit layers. For example, the substrate with two-layer circuit layers used for 256 Input/output (I/O) ball grid array package has the unit price of USD 0.5~0.8. Under the same requirements, if the package is accomplished by the substrate with four-layer circuit layers, the unit price thereof is USD 1.6~4.0. Accordingly, the reduction in the number of the circuit layers may greatly cut down the direct material cost in manufacturing.

FIG. 2 is a schematic cross-sectional diagram of a conventional multi-chip module packaging device 20, which uses flip-chip method to mount the first chip 21 and the second chip 22 on the substrate 23, respectively. The electrical signal will be transmitted between the two chips, and it is through the metal layers of the substrate 23, the bump 24 of the first chip 21 and the bump 25 of the second chip 22 to complete the complex transmissions. The substrate 23 can serve as the signal transmission path between the chips, and it has another important function of serving as the signal transmission path between the chip and the external system (e.g. the mother board of a computer, figure not shown), which is achieved by the solder balls 26 under the substrate 23. If it is desired that more circuit traces may be contained on the limited layout area of the substrate 23, a substrate with more circuit layers needs to be designed, and the circuit routing through the added circuit layers must be completed. If it is desired to have more functions or I/Os in the same packaging area of an electrical device, the number of circuit layers for the substrate must be relatively increased, and thus the problem of increased production cost is accompanied.

SUMMARY OF THE INVENTION

The invention provides a multi-chip module packaging device, which can reduce the number of circuit layers for the substrate in prior art and maintain the same electrical functions, and furthermore save on the production cost.

In order to achieve above-mentioned objects, the invention discloses a multi-chip module packaging device, including a substrate and at least two chips, the at least two chips mounted on the substrate by flip-chip bonding. The at least two chips have their respective active surface, and the active surface provides a plurality of bonding pads which have respective under bump metallurgies (UBM) and respective bumps thereon in sequence. The character of the invention resides in that there is a lateral extension portion in the under bump metallurgy, which is not covered by the bump and the area thereof is sufficient for the wire bonding operation. The at least two chips use at least one metal bonding wire to electrically connect to the extension portion of the Under Bump Metallurgy respectively.

BRIEF DESCRIPTION OF THE DRAWINGS

The invention will be described according to the appended drawings in which.

PREFERRED EMBODIMENT OF THE PRESENT INVENTION

Figure 1:
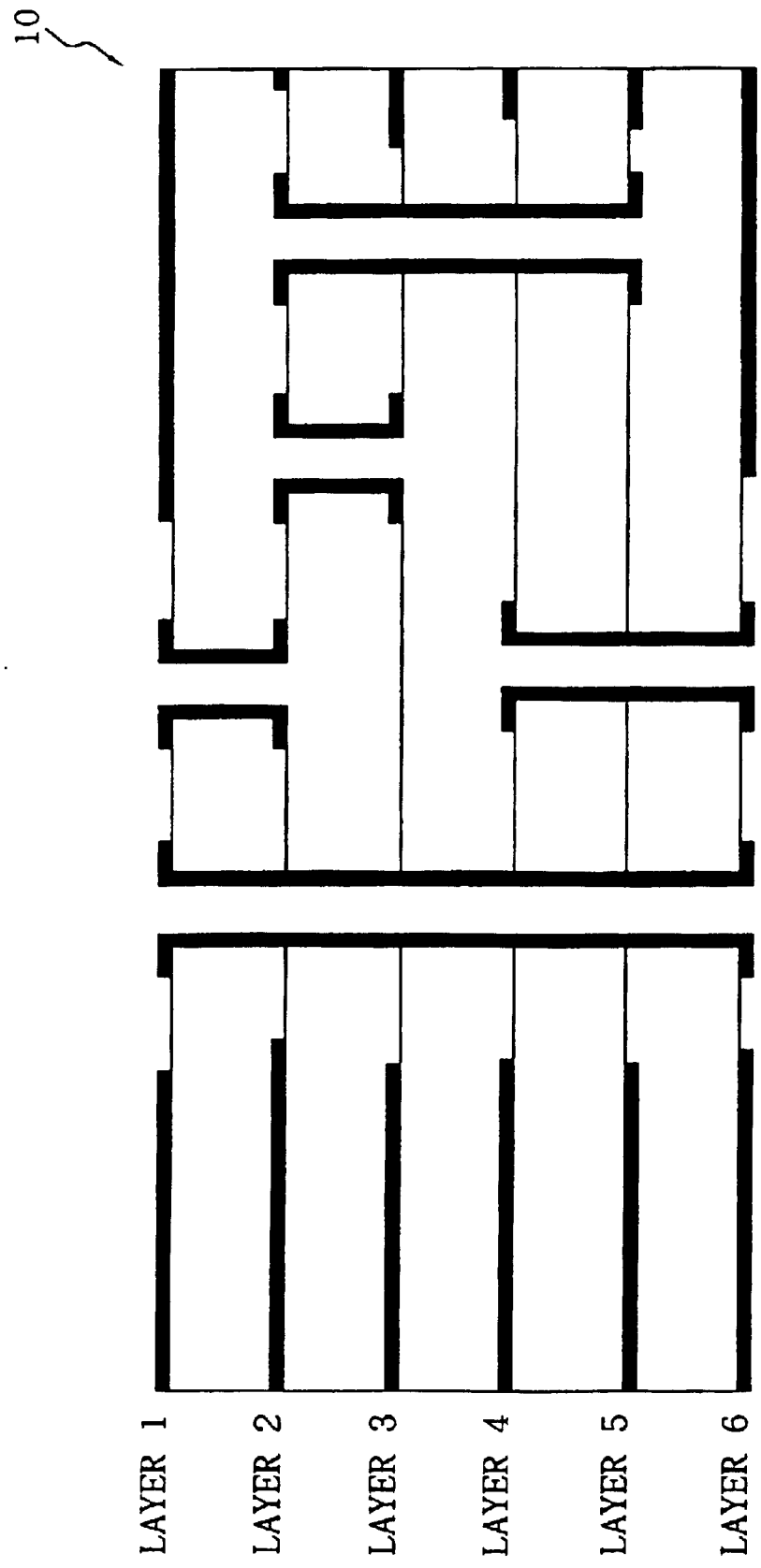
FIG. 1 is a schematic representation of a substrate with six-layer circuit layers in a prior art.
Figure 2:
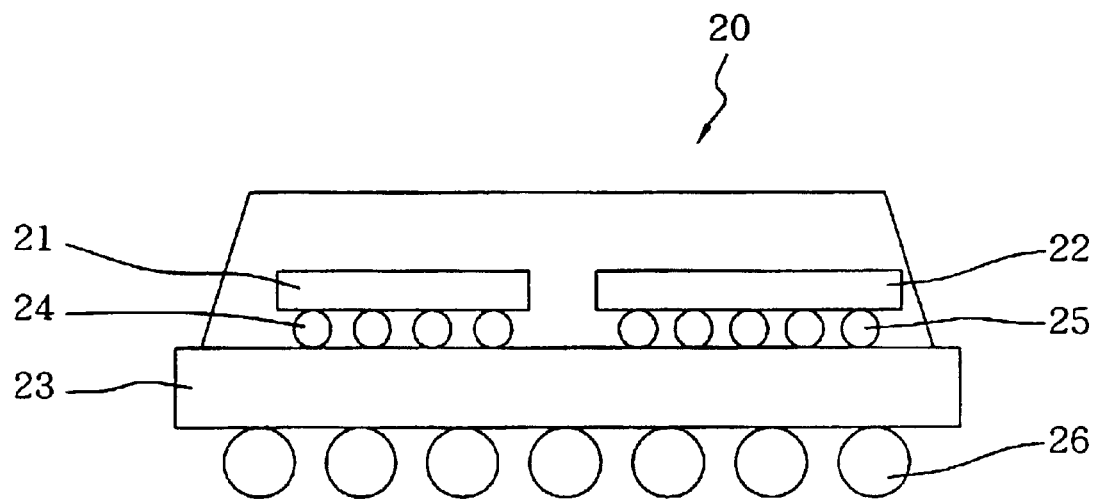
FIG. 2 is a schematic cross-sectional representation of a conventional multi-chip module packaging device.
Figure 3:
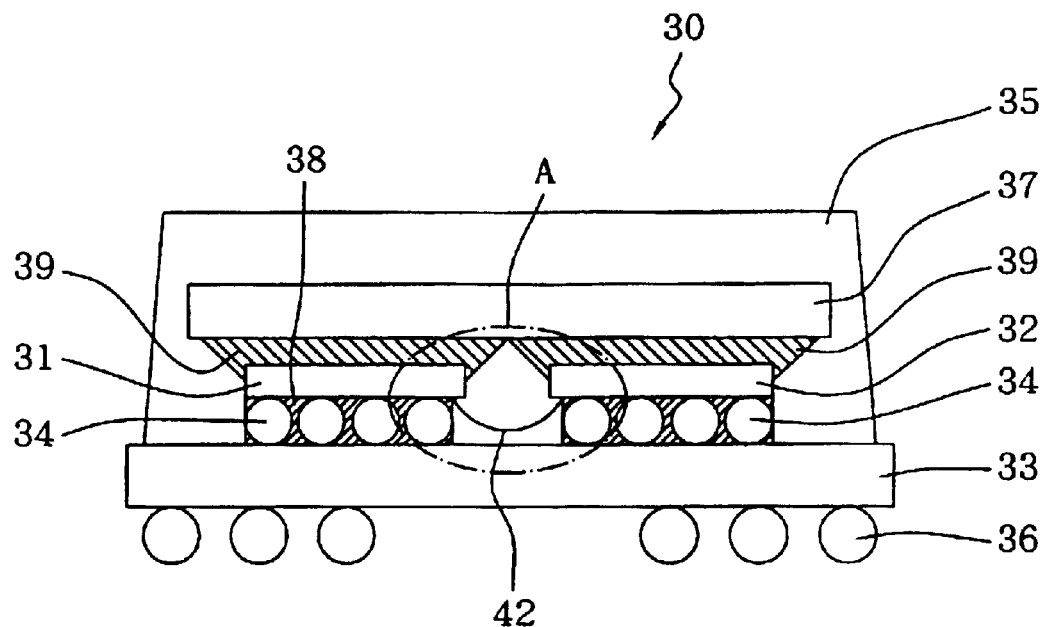
FIG. 3 is a schematic representation of a multi-chip module packaging device in accordance with the invention.

FIG. 3 is a schematic representation of a multi-chip module packaging device according to a preferred embodiment of the invention. The multi-chip module packaging device 30 includes a metal heat sink 37, a first chip 31, a second chip 32, a substrate 33, and a plurality of solder balls 36. The first chip 31 and second chip 32 have respective active surfaces with metal circuits and respective inactive surfaces opposite to the active surfaces. A plurality of bumps 34 are bumped on the active surface which is to be welded with the substrate 33 by the flip-chip technology, and internal voids between the plurality of bumps 34 are filled with the underfill adhesive 38. The underfill adhesive 38 may absorb most of the mechanical stresses to prevent the interconnection damage of bumps 34 from excess stresses. The bottommost surface of the substrate 33 provides with a plurality of solder balls 36, which are used as electrical connections for fixing and communication by the multi-chip module packaging device 30 with the external system. The first chip 31 and second chip 32 may use a thermal-conductive but not electric-conductive adhesive 39 (e.g. epoxy resin or slight metal powders ontent) to combine with the metal heat sink 37. The metal heat sink 37 can not only fix the first chip 31 and the second chip 32, but also effectively reduce the working temperature of the first chip 31 and second chip 32. The encapsulant 35 may protect the first chip 31, the second chip 32 and the metal bonding wire 42 against contamination and corrison from moisture and dust.

Figure 4:
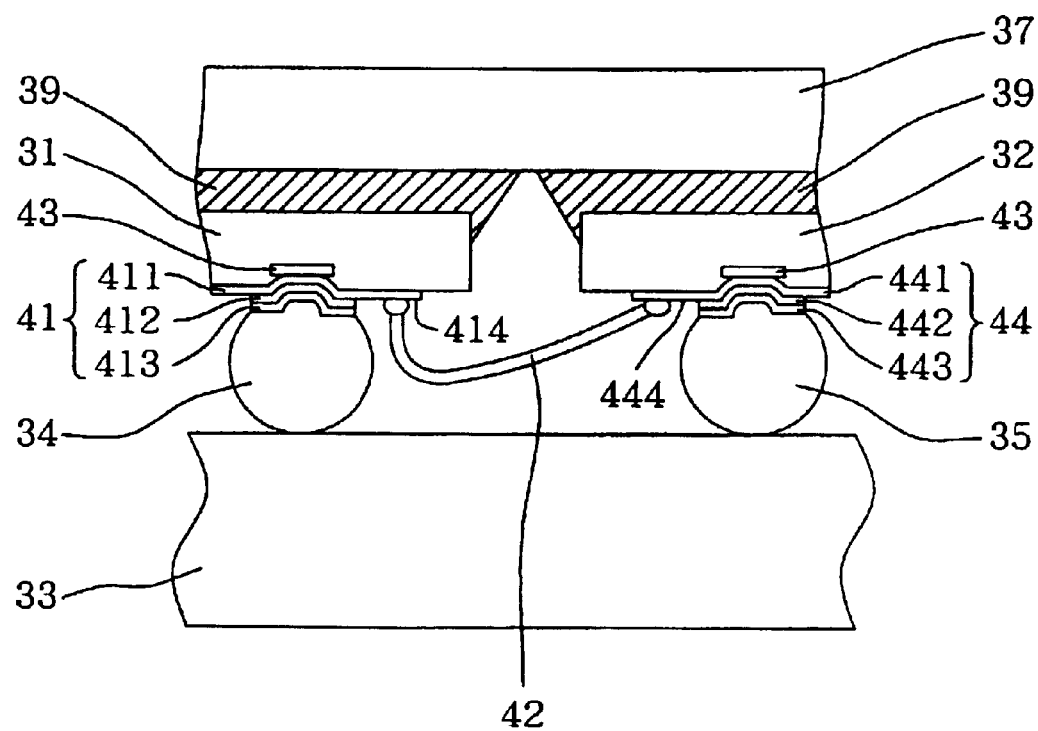
FIG. 4 is an enlarged schematic representation of the region A in FIG. 3.

FIG. 4 is an enlarged schematic representation of region A in FIG. 3. The first UBMs 41 are provided between the first chip 31 and the corresponding plurality of bumps 34, and the second UBMs 44 are provided between the second chip 32 and the corresponding plurality of bumps 34 in the same way. The first UBMs 41 and the second UBMs 44 have many functions such as adhesion, diffusion barrier, solder wetting and anti-oxidation, etc. Generally, the surfaces of the first chip 31 and the second chip 32 must be deposited a protection layer or passive layer (not shown) to protect circuit traces and prevent arbitrary wetting of solders. Thereafter, after forming the opening windows over the locations of the bonding pads 43 of the first chip 31 and of the second chip 32, the first UBM 41 and the second UBM 44 containing three to four laminated metal layers are formed by sputtering or electroplating. If the material of the bonding pads 43 of the first chip 31 and the second chip 32 is Al, the first UBM 41 and the second UBM 44 include an adhesion layer 411 and 441 made from Al, a barrier layer 412 and 442 made from NiV, and a wetting layer 413 and 443 made from Cu. If the material of the bonding pads 43 is Cu, the first UBM 41 and the second UBM 44 include an adhesion layer 411 and 441 made from Ti or Cr, a barrier layer 412 and 442 made from NiV, and a wetting layer 413 and 443 made from Cu. The lateral of the adhesion layer 411 and 441 provides the extension portions 414 and 444. The extension portions 414 and 444 extend from the lateral, which serves as the bonding area for the bonding wire. As for forming the extension portions 414 and 444, it is necessary to use specially designed photomask during manufacturing of the bumps, through processes of exposure, development, deposition and etching, etc. These make UBMs covered by the bumps in a prior art partly extend in at least one direction from the laterals and remain during the etching process. The extension direction and size of the extension portion 414 and 444 should take the wire bonding operation requirement into consideration. The invention uses a metal bonding wire 42, such as an Au wire or Al wire, to electrically connect the extension portion 414 of the adhesion layer 411 of the first UBM 41 with the extension portion 444 of the adhesion layer 441 of the second UBM 44. As the wedge/wedge bonding is applied, it may replace the Au wire with Al wire. If the height limit (70 $\mu$m~100 $\mu$m) for the bump 34 is considered, the loop height formed by wedge/wedge bonding is of better condition. Furthermore, it is also possible to extend the whole layer of UBM 41 and 44 from the laterals as an extension portion, and make the wetting layer 413 and 443 of the extension portion become the bond area of the metal bonding wire. In addition, the encapsulant 35 may be used to protect the first chip 31, the second chip 32 and the metal bonding wire 42 against the contamination and damage from moisture and dust.

Due to above-mentioned technological characteristics, the multi-chip module packaging device of the present invention has the follwing advantages:

1. Using the wire bonding technology to minimize the number of circuit layers of the substrate may greatly reduce the production cost of the packaging device.
2. Using the substrate with fewer circuit layers may relatively reduce the total thickness of the packaging device.
3. Wire bonding technology is a conventional packaging technology, which is easy to achieve and practice, and is preferred with easy manufacturing and higher production yield compared to the conventional six-layer circuit substrate.
4. Using the metal heat sink with better heat dissipative characteristic may enhance the heat dissipation capability of the packaging device.

Furthermore, the above-mentioned embodiment is illustrated with only two chips (first chip 31 and second chip 32), but is not confined by the invention. The invention still may be suitable for the multi-module packaging with more than two chips. Besides, the first chip 11 and the second chip 12 do not need to be configured above the substrate 33, which may also be optionally configured under the substrate 33 or inside a hollow substrate. The substrate 33 may use the solder balls 36 to electrically connect to a printed circuit board (not shown), and may also use surface mounting or other ways to electrically connect to the printed circuit board, circuit board not confined by the invention.

The above-described embodiments of the present invention are intended to be illustrative only. Numerous alternative embodiments may be devised by persons skilled in the art without departing from the scope of the following claims.

What is claimed is:

1. A multi-chip module packaging device, comprising:

a substrate;

a first chip having an inactive surface and an active surface having a plurality of bonding pads thereon;

a second chip having an inactive surface and an active surface having a plurality of second bonding pads thereon;

at least one first under bump metallurgy formed on said first bonding pads of said first chip, said at least one first under bump metallurgy having a first extension portion;

at least one second under bump metallurgy formed on said second bonding pads of said second chip said at least one second under bump metallurgy having a second extension portion;

at least one bonding wire having a first end connected to the first extension of the at least one first under bump metallurgy and a second end connected to the second extension of the at least one second under bump metallurgy; and a plurality of bumps, one side of each bump joined to said at least one first under bump metallurgy or said at least one second under bump metallurgy and another side of each bump joined to said substrate.

2. The multi-chip module packaging device of claim 1, further comprising at least one heat sink fixed on one of said chips by a thermal-conductive and electric-insulating adhesive.

3. The multi-chip module packaging device of claim 1, wherein said under bump metallurgy includes an adhesion layer deposited on said bonding pad, and said adhesion layer has at least an extension portion for electrically connecting to said bonding wire.

4. The multi-chip module packaging device of claim 1, wherein said bonding wire is selected from the group consisting essentially of Au, Al and the alloy thereof.

5. The multi-chip module packaging device of claim 2, wherein said adhesive is made from epoxy resin.

6. The multi-chip module packaging device of claim 2, wherein said adhesive includes metal powders.

7. The multi-chip module packaging device of claim 1, wherein internal voids between the plurality of bumps are filled with an underfill adhesive.

8. The multi-chip module packaging device of claim 1, further comprising a plurality of solder balls welded on said substrate.

9. The multi-chip module packaging device of claim 1, further comprising an encapsulant for protecting said chips and said metal bonding wires.

10. The multi-chip module packaging device of claim 1, wherein the extension portion extends along the active surface of a chip.

11. The multi-chip module packaging device of claim 3, wherein the extension portion extends along the active surface of a chip.

* * * * *